United States Patent [19]

Gehring

[11] Patent Number: 4,980,341

[45] Date of Patent: Dec. 25, 1990

[54] METHOD OF FABRICATING GRAIN BOUNDARY JOSEPHSON JUNCTION

[75] Inventor: Karl A. Gehring, Oly, England

[73] Assignee: The General Electric Company, p.l.c., England

[21] Appl. No.: 313,374

[22] Filed: Feb. 21, 1989

[30] Foreign Application Priority Data

Feb. 26, 1988 [GB] United Kingdom ................ 8804568

[51] Int. Cl.$^5$ ...................... H01L 39/22; H01L 39/24
[52] U.S. Cl. ........................................ 505/1; 156/610;
156/643; 204/192.24; 427/62; 437/910;
505/702
[58] Field of Search ................... 156/610, 643; 427/62;
204/192.24; 437/910; 505/1; 1/702

[56] References Cited

U.S. PATENT DOCUMENTS 4,316,785 2/1982 Suzuki et al. ........................ 437/910

FOREIGN PATENT DOCUMENTS 0299163 1/1989 European Pat. Off. ................ 505/1
3241824 10/1988 Japan .................................... 505/702

OTHER PUBLICATIONS

Gao et al., Intl. Jour. Modern Physics B. V-1 (1987), 583.
Nakayama et al., Jap. Jour. Appl. Phys. 26 (Dec. 1987), L-2055.
Koch et al., Appl. Phys. Lett. 51 (1987), 200.
Rothschild et al., IEEE-Electron Device Letts. 9 (Feb. 1988), 68.
Liberts et al., Appl. Phys. A46 (Aug. 1988), 331.
Koch et al. in High Tc Superconductors, ed. Gubser et al., Apr. 87, Mrs, Pittsburgh.

Primary Examiner—Upendra Roy
Attorney, Agent, or Firm—Kirschstein, Ottinger, Israel & Schiffmiller

[57] ABSTRACT

A superconducting electronic device utilizes a weak link (Josephson junction) between two regions of superconductor material. A method of making such a device having a granular structure consists of taking a substrate with a predetermined grain size, and forming a thin film of superconducting ceramic upon it. The film adopts the grain size and structure of the substrate, and the film is then processed to form two relatively large areas of granular film connected by a thin link which contains a single grain boundary which acts as the weak link.

15 Claims, 1 Drawing Sheet

METHOD OF FABRICATING GRAIN BOUNDARY JOSEPHSON JUNCTION

BACKGROUND OF THE INVENTION

1. Field of the Invention

Known superconducting electronic devices are based on the properties of a weak link (or Josephson junction) between two bodies of superconducting material. Such a weak link may be formed using (i) a point contact, (ii) a microbridge, or (iii) a thin insulating barrier between the superconducting bodies.

2. Description of Related Art

The recently discovered ceramic superconductors offer advantages compared with conventional superconductors in that they become superconducting at more easily accessible temperatures. These materials are difficult to handle for several reasons and, in particular, require high processing temperatures which are incompatible with conventional microfabrication technology (such as photolithography).

However the ceramic superconductors form naturally into a granular structure in which the boundaries between the grains act as natural weak links. These natural weak links have already been exploited in the demonstration of SQUID-like behaviour. In this demonstration the superconducting circuit is formed from random loops of interconnected grains within a ceramic specimen in which the grain boundaries have the appropriate weak link behaviour.

SUMMARY OF THE INVENTION

This invention seeks to utilise this granular property in the controlled fabrication of superconducting electronic devices.

According to this invention, a method of making a superconducting electronic device includes the steps of forming on a substrate having a predetermined grain size and structure, a thin film of superconducting ceramic so that the film adopts a grain size and structure compatible with that of the substrate; selectively processing the film to form relatively large areas of granular film connected by a relatively thin link region of granular film.

BRIEF DESCRIPTION OF THE DRAWINGS

An embodiment of the invention will now be described, by way of example, with reference to the accompanying drawings, in which.

DETAILED DESCRIPTION OF THE PREFERRED EMBODIMENT

Figure 1:
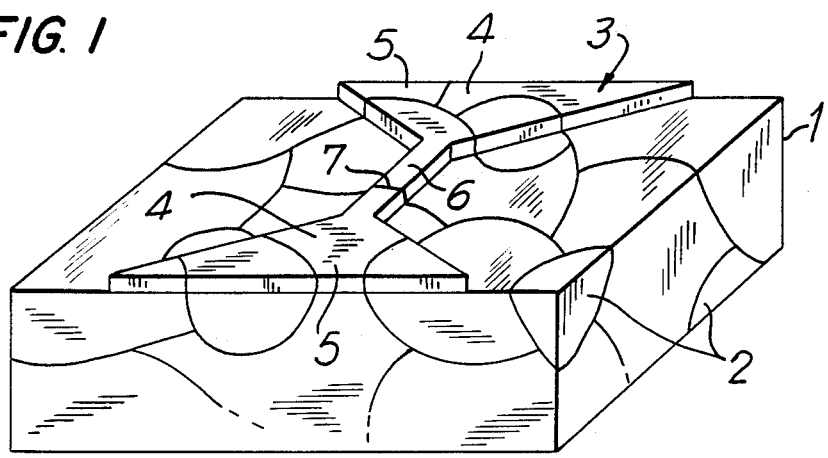
FIG. 1 is a schematic pictorial view of a substrate with a superconducting film formed thereon.

Referring to FIG. 1, a substrate 1 having a granular structure indicated by grains 2 has a superconductive film 3 deposited thereon. The grains 4 of the film 3 mimic the underlying granular structure of the substrate. The film 3 is patterned to have two relatively large areas 5, interconnected by a narrow region 6. It will be seen that a grain boundary 7 occurs in the region 6, and thus acts as a Josephson junction.

The thickness of the film is preferably no more than the size of a single typical grain, and it may be significantly less than that of a typical grain size. The width of the link region preferably corresponds to just a few grain sizes, and it is desirable that it has a minimum width corresponding to the dimension of a single grain.

The thin link region may be produce by physically removing the film material from one or both sides to leave just a necked region of granular superconducting ceramic. Alternatively, the properties of the film on each side of the link region may be selectively modified so that it no longer has superconducting behaviour.

Thus the grain size of the superconducting ceramic may be controlled by using a substrate of another ceramic material which has been prepared using grains of a preselected range of sizes. When a film of superconductor is deposited on the substrate, using a method suitable for epitaxial growth, then the grain size and structure in the film will match that of the substrate. A comparatively crude and cheap method of defining the superconducting device may now be used. In particular a necked down region whose dimensions are comparable with the grain dimensions will have a high probability of containing just one (or other desired number) weak link. These devices would be cheap to manufacture and could be accepted or rejected by some test procedure.

Various ways of defining the device geometry include:

(a) Deposition of a patterned poisoning layer on the substrate before the deposition of the superconductor. The pattern needs to be a "negative" of the device structure so that only those parts of the superconducting layer required for the device structure do not have their superconducting properties suppressed by the poisoning mechanism.

Figure 2:
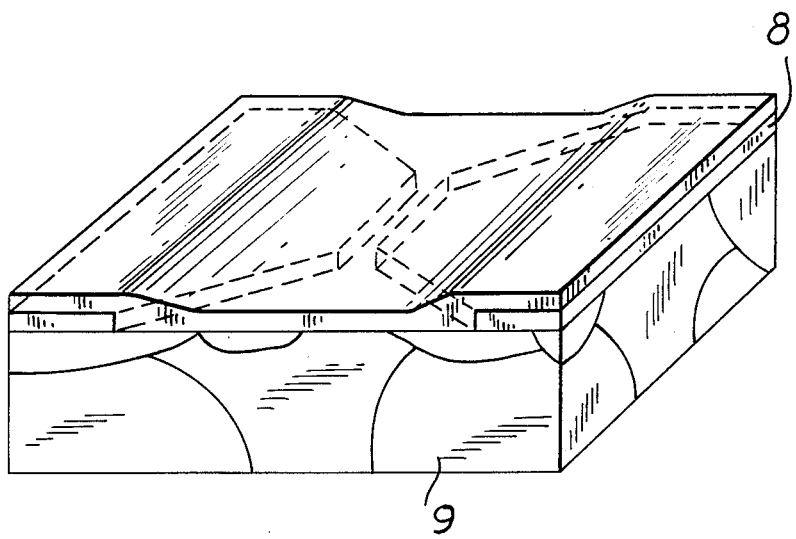
FIG. 2 is a schematic pictorial view showing the use of a pensioning layer for determining the configuration of the superconducting film.

FIG. 2 shows such a patterned poisoning layer 8 of, for example, silicon dioxide or aluminum dioxide, deposited on the substrate 9 and covered with a layer 10 of potentially superconducting material. The poisoning layer prevents the material thereover from becoming superconducting, and therefore has the effect of forming the required shape of the superconducting region.

(b) Deposition of a patterned layer on top of the superconducting layer. This top layer has a poisoning effect as in (a) or some other inhibiting property such as providing a barrier to the diffusion of oxygen, and in these cases a negative pattern would be required. Alternatively the top layer might be of such material as to enable production of the superconducting region thereon, such as providing some reactive constituent necessary for the formation or enhancement of the superconducting phase and in this case a positive pattern is required. A positive mask may be used to shield the superconductor from subsequent processing which degrades the superconducting properties.

Alternatively the narrow regions might be shaped by laser machining, the regions containing only one (or other desired number of) natural intergranular weak link.

In one example of the invention a substrate material is selected from the following material:

(a) $SrTiO_3$
(b) MgO
(c) Zirconia, $ZrO_2$ or Yttria stabilized zirconia (YSZ)
(d) A material containing a different phase of the same elements as the superconductor, e.g. if the superconductor is $Y_1Ba_2Cu_3O_7$ the substrate could be $Y_2BACuO_5$.

The substrate material is processed to form a substrate having a grain size in the range 0.1 μm to 10 μm. A typical superconducting ceramic material is $Y_1Ba_2Cu_3O_{7-x}$ where x is a small fraction typically in the range 0 to 0.5.

The film of the superconducting ceramic is formed by epitaxial growth on the substrate, and the film is grown until it has a thickness of about one grain size or slightly less. Deposition of an epitaxial layer can be performed using one of the following methods:

(a) Vacuum deposition, e.g. evaporation or the use of molecular beam epitaxy.
(b) Chemical vapour deposition.
(c) Liquid phase deposition.
(d) Surface recrystallisation.

When the film has been formed, regions of its area are selectively removed using laser machining to leave a narrow link which connects two relatively large areas. The width of the link is shaped so that at its narrowest portion, it has a width corresponding to the dimension of a single grain. There is therefore a high probability of it behaving as a Josephson junction. The process is simple and repeatable allowing the possibility of a satisfactory manufacturing technique suitable for quantity production of superconducting electronic devices.

I claim:

1. A method of making a superconducting device, including the steps of forming on a substrate having a predetermined grain size and structure, a thin film of superconducting ceramic so that the film adopts a grain size and structure compatible with that of the substrate; and selectively processing the film to form relatively large areas of granular film connected by a relatively thin link region of granular film having a grain boundary therein.

2. A method as claimed in claim 1, wherein the substrate is formed of a ceramic material.

3. A method as claimed in claim 1, wherein the superconducting film is deposited by epitaxial growth.

4. A method as claimed in claim 1, wherein the thickness of the superconducting film is no greater than the size of a typical grain of the substrate material.

5. A method as claimed in claim 1, wherein a patterned layer of a material is deposited on the substrate before deposition of the superconducting film to suppress the superconducting properties of the film over a selected region or regions.

6. A method as claimed in claim 1, wherein a patterned layer of a material is deposited over the superconducting film to suppress the superconducting properties of the film over a selected region or regions.

7. A method as claimed in claim 1, wherein the geometry of the device is determined by selective laser machining.

8. A method as claimed in claim 1, wherein the superconducting film is formed of $Y_1Ba_2Cu_3O_{7-x}$ where x lies between 0 and 0.5.

9. A method as claimed in claim 1, wherein the substrate material is selected from $SrTiO_3$, $MgO$, $ZrO_2$, or yttria stabilized zirconia.

10. A method as claimed in claim 5, wherein the patterned layer suppresses the superconducting properties by poisoning the superconducting layer over said region or regions.

11. A method as claimed in claim 5, wherein said patterned layer results in a narrow superconductive link region between two larger areas of the superconductive film.

12. A method as claimed in claim 6, wherein the patterned layer suppresses the superconducting properties by inhibiting over said region or regions a process which is required to achieve superconductivity of said film.

13. A method as claimed in claim 7, wherein said laser machining results in a narrow superconductive link region between two larger areas of the superconductive film.

14. A method as claimed in claim 11, wherein the width of said narrow link region is comparable to the grain size.

15. A method as claimed in claim 14, wherein said grain boundary in said narrow link region acts as a Josephson junction.

* * * * *